United States Patent [19]

Guo et al.

[11] Patent Number: 5,315,545
[45] Date of Patent: May 24, 1994

[54] HIGH-VOLTAGE FIVE-TRANSISTOR STATIC RANDOM ACCESS MEMORY CELL

[75] Inventors: Ta-Pan Guo, Cupertino; Adi Srinivasan, Fremont, both of Calif.

[73] Assignee: Aptix Corporation, San Jose, Calif.

[21] Appl. No.: 77,299

[22] Filed: Jun. 15, 1993

Related U.S. Application Data

[63] Continuation-in-part of Ser. No. 900,241, Jun. 17, 1992, Pat. No. 5,239,503, and a continuation-in-part of Ser. No. 2,776, Jan. 8, 1993.

[51] Int. Cl.$^5$ .............................................. G11C 11/40
[52] U.S. Cl. .................................... 365/156; 365/154; 365/189.11
[58] Field of Search ................. 365/154, 156, 189.11

[56] References Cited

U.S. PATENT DOCUMENTS

| | | | |
|---|---|---|---|
| 4,287,574 | 9/1981 | Uchida | 365/156 |
| 4,403,306 | 9/1983 | Tokushige et al. | 365/156 |
| 4,536,859 | 8/1985 | Kamuro | 365/154 |
| 4,541,073 | 9/1985 | Brice et al. | 365/156 |
| 4,779,226 | 10/1988 | Haraszti | 365/49 |
| 4,816,706 | 3/1989 | Dhong et al. | 307/530 |
| 5,111,429 | 5/1992 | Whitaker | 365/156 |

*Primary Examiner*—Eugene R. LaRoche
*Assistant Examiner*—Do Hyun Yoo
*Attorney, Agent, or Firm*—D'Alessandro, Frazzini & Ritchie

[57] ABSTRACT

According to a first aspect of the present invention, a static random access memory cell according to the present invention includes two stages. The first stage has a first P-Channel MOS transistor with its source connected to a high-voltage supply rail, and its drain connected to the drain of a first N-Channel MOS transistor. The source of the first N-Channel MOS transistor is connected to the drain of a second N-Channel MOS transistor. The source of the second N-Channel MOS transistor is connected to a $V_{SS}$ power supply rail. The second stage has a second P-Channel MOS transistor with its source connected to the high-voltage supply rail $V_{HS}$, and its drain connected to the drain of a third N-Channel MOS transistor. The source of the third N-Channel MOS transistor is connected to the drain of a fourth N-Channel MOS transistor. The source of the fourth N-Channel MOS transistor is connected to $V_{SS}$. The gates of the first and second P-Channel MOS transistors are cross-coupled and the gates of the second and fourth N-Channel MOS transistors are cross-coupled. The gates of the first and third N-Channel MOS transistors are connected together to power supply rail $V_{DD}$, usually 5 volts. The first and second P-Channel MOS transistors are formed in an n-well biased at a constant power supply voltage. In a preferred embodiment the constant power supply voltage may be $V_{HS}$. A bit line coupled to the drain of the second N-Channel MOS transistor through a fifth N-Channel MOS transistor, having its gate connected to a word line.

6 Claims, 2 Drawing Sheets

HIGH-VOLTAGE FIVE-TRANSISTOR STATIC RANDOM ACCESS MEMORY CELL

RELATED APPLICATIONS

This application is a continuation-in-part of co-pending patent application Ser. No. 07/900,241, filed Jun. 17, 1992, now U.S. Pat. No. 5,239,503, and co-pending patent application Ser. No. 08/002,776, filed Jan. 8, 1993 (APTX-016), which are both hereby expressly incorporated herein by reference.

BACKGROUND OF THE INVENTION

1. Field of the Invention

The present invention relates to semiconductor memories and to static memory cells. More particularly, the present invention relates to a high-voltage five-transistor static random access memory cell.

2. The Prior Art

CMOS Static Random Access Memory (SRAM) cells are known in the art. A typical prior-art SRAM cell is found in a memory product designated 5101 and manufactured by Intel Corporation of Santa Clara, Calif. The SRAM cell in this product includes six transistors, four of which constitute a cross-coupled latch, and two of which constitute gating devices used to couple the latch to two bit lines (data lines) when the memory cell is selected. These two bit lines are typically connected to a differential amplifier which amplifies the difference in voltage levels on the bit lines. The amplified difference is then interpreted as a logical 0 or a logical 1, according to some design convention.

To write a bit into the memory cell, the memory cell is selected and its bit lines are charged to opposite states by a write driver circuit. The six-transistor prior-art SRAM memory cell requires two gating devices (pass transistors) and two bit lines to be reliably read and written.

In certain applications, it is desirable to provide a high-voltage SRAM memory cell. To implement a high-voltage SRAM memory cell using prior-art techniques involves using a desired signal as an input to a level-shifter circuit which is used to develop a new high-voltage-level signal at its output. The high-voltage potential may be, for example, a programming voltage level ($V_{HS}$), a power-supply voltage level or a charge pump voltage. Prior-art circuits for performing this function are characterized by static power consumption.

BRIEF DESCRIPTION OF THE INVENTION

According to a first aspect of the present invention, a static random access memory cell according to the present invention includes two stages. The first stage comprises a first P-Channel MOS transistor having its source connected to a high-voltage supply rail, and its drain connected to the drain of a first N-Channel MOS transistor. The source of the first N-Channel MOS transistor is connected to the drain of a second N-Channel MOS transistor. The source of the second N-Channel MOS transistor is connected to a $V_{SS}$ power supply rail. The second stage comprises a second P-Channel MOS transistor having its source connected to the high-voltage supply rail $V_{HS}$, and its drain connected to the drain of a third N-Channel MOS transistor. The source of the third N-Channel MOS transistor is connected to the drain of a fourth N-Channel MOS transistor. The source of the fourth N-Channel MOS transistor is connected to $V_{SS}$. The gates of the first and second P-Channel MOS transistors are cross-coupled and the gates of the second and fourth N-Channel MOS transistors are cross-coupled. The gates of the first and third N-Channel MOS transistors are connected together to power supply rail $V_{DD}$, usually 5 volts. The first and second P-Channel MOS transistors are preferably formed in an n-well biased at a constant power supply voltage. In a preferred embodiment of the present invention, the constant power supply voltage is $V_{HS}$. A bit line coupled to the drain of the second N-Channel MOS transistor through a fifth N-Channel MOS transistor, having its gate connected to a word line.

According to a second aspect of the present invention, by limiting $V_{HS}$ to 10 volts or less and varying $V_{HS}$ so that during write operations it is at a first value and during read operations it is at a second value greater than the first value, the first and third N-Channel MOS transistors may be omitted from the circuit, resulting in a reduction in the transistor count of almost 30%.

A transistor or other switching device may be controlled by the contents of the SRAM cell in either of the above versions of the invention.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons. The present invention is now described in further detail with reference to the drawings which illustrate various embodiments within the scope of the invention.

Figure 1:
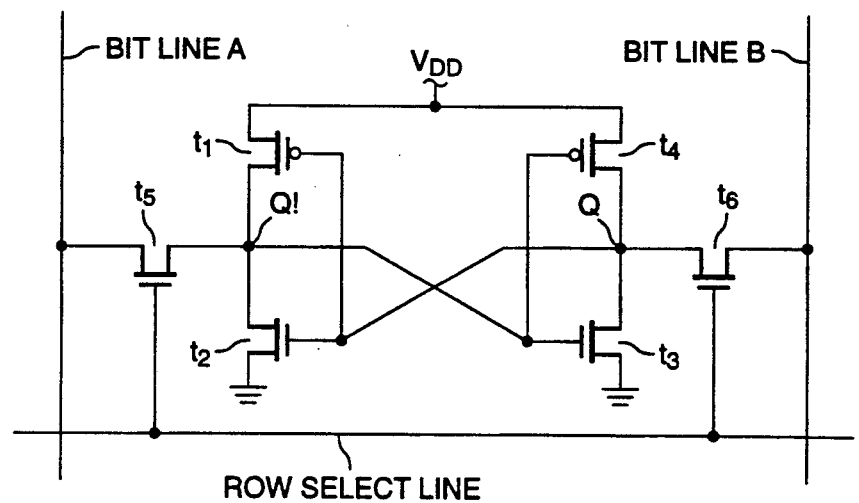
FIG. 1 is a schematic diagram of a typical prior-art static RAM cell.

Referring first to FIG. 1, a prior-art six-transistor SRAM memory cell of the type employed in memory devices such as the Intel 5101 SRAM is depicted in schematic diagram form. Transistors $t_1$, $t_2$, $t_3$ and $t_4$ constitute a cross-coupled latch. Transistors $t_5$ and $t_6$ are pass transistors used as gating devices to couple the bit lines A and B (datalines) to the latch when the voltage on the row select line (address line) is high (at 5 volts). The output signal at node Q is a logical 1 when N-Channel transistor $t_3$ is off and P-Channel transistor $t_4$ is on, and it is a logical zero when these states are reversed.

The six-transistor SRAM memory cell of FIG. 1 requires two gating devices (pass transistors) $t_5$ and $t_6$ and two bit lines A and B to be reliably read and written. Reading and writing are accomplished through the left and right bit lines of the memory cell of FIG. 1. For example, to read the data out of the memory cell in FIG. 1, a logic high signal is applied to the row select line, turning on transistors $t_5$ and $t_6$. If a logical 0 is on node Q! and a logic 1 is on node Q, bit line A is charged to a lower level than bit line B. These two bit lines are typically connected to the inputs of a differential amplifier (not shown) which amplifies the difference in voltage levels on the bit lines. The amplified difference is then interpreted as a logical 0 or a logical 1, according to some design convention.

To write a bit into the memory cell, the row select line is brought high and bit lines A and B are charged to opposite states by a write-driver circuit (not shown), which drives node Q! to the same logical level as the bit line A and node Q to the same logical level as bit line B through transistors $t_5$ and $t_6$.

To implement a high-voltage SRAM memory cell using the prior-art circuit of FIG. 1, the desired signal (Q or Q!) is used as an input to a level-shifter circuit which has a high voltage output to output a new "high-voltage" level, $V_{HS}$ (derived, for example, from a separate power supply or an on-chip charge pump). Alternatively, process changes would be needed to allow the N-Channel transistors $t_2$ and $t_3$ to tolerate the potential voltage difference $V_{HS} - V_{SS}$ with no gate-aided breakdown.

According to the present invention, a static RAM cell 10 with a built-in level-shifter is provided. The cross-coupled latch of the memory cell of the present invention includes a first and a second stage with the output of the first stage connected to the input of the second stage, and the output of the second stage connected to the input of the first stage.

Each stage of level-shifting SRAM cell 10 has three transistors. The first stage comprises P-Channel MOS transistor 12 having its source connected to high-voltage supply rail $V_{HS}$, and its drain connected to the drain of N-Channel MOS transistor 14. The high voltage, which, for the purposes of this disclosure will be referred to herein as $V_{HS}$ (preferably greater than $V_{DD}$ and less than or equal to 20 volts, where $V_{DD}$ is the logic-high voltage of the bit line and word line drivers), may be supplied from an external supply or may be internally generated within the chip, as with a charge-pump circuit.

The source of N-Channel MOS transistor 14 is connected to the drain of N-Channel MOS transistor 16. The source of N-Channel MOS transistor 16 is connected to power supply rail $V_{SS}$ (usually ground). The second stage comprises P-Channel MOS transistor 18 having its source connected to high voltage supply rail $V_{HS}$, and its drain connected to the drain of N-Channel MOS transistor 20. The source of N-Channel MOS transistor 20 is connected to the drain of N-Channel MOS transistor 22. The source of N-Channel MOS transistor 22 is connected to power supply rail $V_{SS}$.

The gates of P-Channel MOS transistors 12 and 18 are cross-coupled as are the gates of N-Channel MOS transistors 16 and 22. The gates of N-Channel MOS transistors 14 and 20 are connected together to power supply rail $V_{DD}$, usually at 5 volts. N-Channel MOS transistors 14 and 20 having their gates connected to $V_{DD}$ are used to protect N-Channel MOS transistors 16 and 22 from gate-aided breakdown. P-Channel MOS transistors 12 and 18 are formed in an n-well, which is biased at power supply voltage $V_{HS}$. A bit line 24 is coupled to the output node 26 of the first stage through N-Channel MOS transistor 28, having its gate connected to word line 30.

If word line 30 and bit line 24 are driven to $V_{DD}$ (5 volts), then the first stage output node 26 and node 34 would be driven to $V_{DD} - V_{TN}$ (about 3.5 volts). This would cause N-Channel MOS transistor 22 to conduct more current and P-Channel MOS transistor 18 to conduct less current. Therefore, node 36 would be driven to zero volts and node 34 would be pulled all the way to $V_{HS}$, since the gate of P-Channel MOS transistor 12 would be pulled to ground with node 36. Because the N-Channel devices 14 and 20 have their gates tied to $V_{DD}$, there is no snap-back or gate-aided breakdown problem for those devices.

Because the highest drain-source voltage across N-Channel MOS transistors 16 and 22 is 3.5 volts ($V_{DD} - V_{TN}$), there is no breakdown issue. P-Channel MOS transistors 12 and 18 do not need to be protected since P-Channel devices always have much larger high voltage breakdown margins than do similar N-Channel devices.

By adding these extra two N-Channel devices 14 and 20, the 5-volt bit line voltage level has been successfully shifted to the $V_{HS}$ level. Since N-Channel MOS transistor 16 would be totally off when P-Channel MOS transistor 12 is on, and N-Channel MOS transistor 22 would be totally off when P-Channel MOS transistor 18 is on, there is no static power consumption in the SRAM cell.

Figure 2:
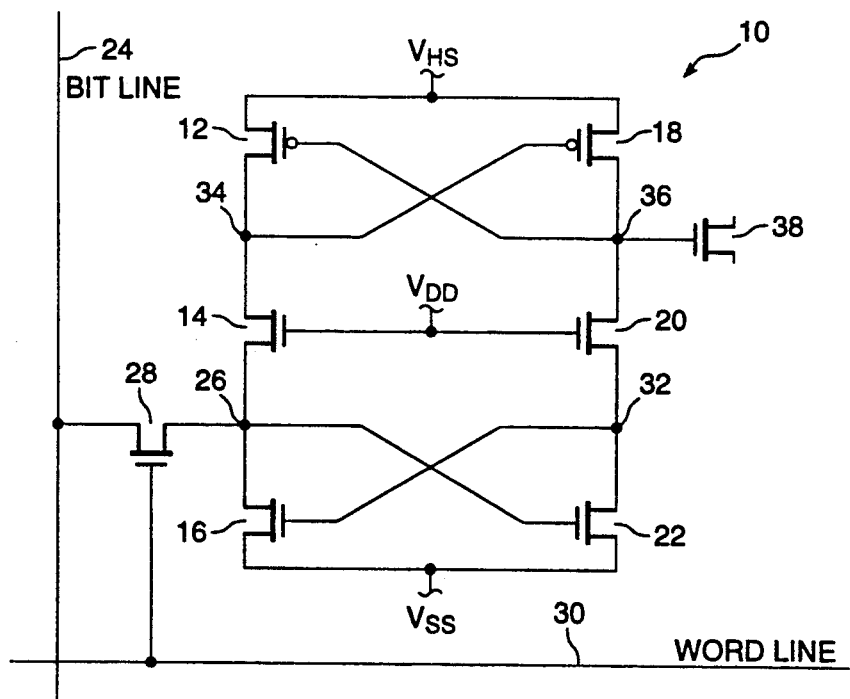
FIG. 2 is a schematic diagram of a static RAM cell with built-in level-shifting according to the first preferred embodiment of the present invention.
Figure 3:
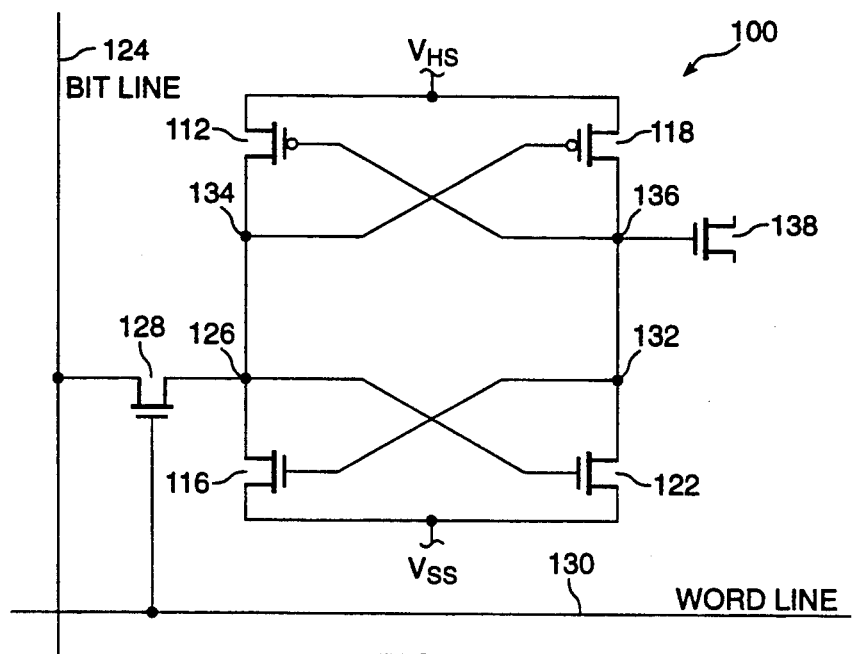
FIG. 3 is a schematic diagram of a five-transistor static RAM cell with built-in level-shifting according to the second preferred embodiment of the present invention.

According to a second preferred embodiment of the present invention as shown in FIG. 3, N-Channel MOS transistors 14 and 20 may be omitted from the circuit of FIG. 2 with the added constraint that $V_{HS}$ have a first and a second value associated with it, the first value being less than the second, the first value used during write operations to the SRAM cell 100 and the second value used during read operations from the SRAM cell 100. The second value is limited to a range of between about 6 and 10 volts, and, is preferably about 7.5 volts. The first value may be 3.5 volts or more (equivalent to $V_{TP} + V_{TN}$ + a noise margin), but must be less than the second value. For example, the first value may be 5 volts and the second value may be 7.5-10 volts. Accordingly, a static RAM cell 100 with a built-in level-shifter is provided. The cross-coupled latch of the memory cell of the present invention includes a first and a second stage with the output of the first stage connected to the input of the second stage, and the output of the second stage connected to the input of the first stage.

Each stage of the level-shifting SRAM cell 100 has two transistors. The first stage comprises P-Channel MOS transistor 112 having its source connected to high-voltage supply rail $V_{HS}$ and its drain connected to the drain of N-Channel MOS transistor 116. The high voltage, now limited to 6-10 volts, may be supplied as discussed above and is switched between the first and second values of $V_{HS}$ depending upon whether a read or write to the SRAM cell 100 is being performed.

The source of N-Channel MOS transistor 116 is connected to power supply rail $V_{SS}$ (usually ground). The second stage comprises P-Channel MOS transistor 118 having its source connected to high voltage supply rail $V_{HS}$, and its drain connected to the drain of N-Channel MOS transistor 122. The source of N-Channel MOS transistor 122 is connected to power supply rail $V_{SS}$.

The gates of P-Channel MOS transistors 112 and 118 are cross-coupled as are the gates of N-Channel MOS transistors 116 and 122. P-Channel MOS transistors 112 and 118 are formed in an n-well, which is biased at power supply voltage $V_{HS}$. A bit line 124 is coupled to the output node 126 of the first stage through N-Channel MOS transistor 128, having its gate connected to word line 130.

If word line 130 and bit line 124 are driven to $V_{DD}$ (5 volts), then the first stage output node 126 and node 134 Would be driven to $V_{DD} - V_{TN}$ (3.5 volts). This would cause N-Channel MOS transistor 122 to conduct more current and P-Channel MOS transistor 118 to conduct less current. Therefore, node 136 would be driven to zero volts and node 134 would be pulled all the way to $V_{HS}$, since the gate of P-Channel MOS transistor 112 would be pulled to ground With node 136.

Because the highest drain-source voltage across N-Channel MOS transistors 116 and 122 is the $V_{HS}$ value during read operations, or 6–10 volts in this example, there is no breakdown issue here where $V_{HS}$ is limited to no more than 10 volts. P-Channel MOS transistors 112 and 118, as discussed before, do not pose a breakdown problem under these conditions.

By constraining $V_{HS}$ as discussed, the 5-volt bit line voltage level has been successfully shifted to the $V_{SS}$ level. Since N-Channel MOS transistor 116 would be totally off when P-Channel MOS transistor 112 is on, and N-Channel MOS transistor 122 would be totally off when P-Channel MOS transistor 118 is on, there is no static power consumption in the SRAM cell.

The level-shifting static RAM cells of the present invention provides several advantages over the prior art. First, they eliminate the need for a separate level-shifting circuit, thus reducing the transistor count and circuit layout area. Conventional SRAM cells can be modified to this circuit without the need to employ process changes.

The high-voltage level-shifted output RAM cells of the present invention are useful for numerous applications. For example, they may be used to drive pass gates to eliminate $V_T$ voltage drops, or for providing a programming voltage for programming other electrical devices such as user-programmable interconnect devices. For example, the gate of transistor 38 may be electrically connected to node 36 or the gate of transistor 138 may be electrically connected to node 136 to provide a switch for switching another circuit or component based upon the content of the SRAM cell 100. Other types of switches could also be used.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A level-shifting static random access memory cell which may be coupled to a bit line and a word line operating at a first set of high and low logic-state voltages substantially equal to a first power-supply rail potential and a second power-supply rail potential, respectively, said level-shifting static random access memory cell having at least one output node operating at a second set of high and low logic-state voltages substantially equal to a third high-voltage power-supply rail potential and said second power-supply rail potential, respectively, said cell comprising:

a first P-Channel MOS transistor having a source connected to said third high-voltage power-supply rail potential, and further having a drain and a gate;

a first N-Channel MOS transistor having a drain connected to said drain of said first P-Channel MOS transistor, and further having a gate connected to said first power-supply rail potential, and a source;

a second N-Channel MOS transistor having a drain connected to said source of said first N-Channel MOS transistor, and further having a source connected to said second power-supply rail potential, and a gate;

a second P-Channel MOS transistor having a source connected to said third high-voltage power-supply rail potential, and further having a drain connected to said gate of said first P-Channel MOS transistor and a gate connected to said drain of said first P-Channel MOS transistor;

a third N-Channel MOS transistor having a drain connected to said drain of said second P-Channel MOS transistor, and further having a gate connected to said first power-supply rail potential, and a source connected to said gate of said second N-Channel MOS transistor;

a fourth N-Channel MOS transistor having a drain connected to said source of said third N-Channel MOS transistor, and further having a source connected to said second power-supply rail potential, and a gate connected to said source of said first N-Channel MOS transistor; and switching means connected to said drain of said second P-Channel MOS transistor for switching a component.

2. The level-shifting static random access memory cell of claim 1 wherein said switching means is a switching transistor having its gate connected to said drain of said second P-Channel MOS transistor.

3. The level-shifting static random access memory cell of claim 2 wherein said switching transistor is an N-Channel MOS transistor.

4. The level-shifting static random access memory cell of claim 3 wherein said first and second p-Channel MOS transistors are fabricated in an n-well, said n-well being biased at said third high-voltage power-supply rail potential.

5. The level-shifting static random access memory cell of claim 4, further including a fifth N-Channel MOS transistor having a source connected to the bit line, a drain connected to said drain of said second N-Channel MOS transistor, and a gate connected to the word line.

6. The level-shifting static random access memory cell of claim 5 wherein said first power-supply rail potential is about 5 volts, said second power-supply rail potential is about zero volts, and said third high-voltage power-supply rail potential is between 8 and 20 volts.

* * * * *